United States Patent
Hiraike et al.

(10) Patent No.: US 8,933,524 B2
(45) Date of Patent: Jan. 13, 2015

(54) SEALING MATERIAL FOR SOLAR CELL, PROTECTIVE SHEET FOR SOLAR CELL, AND PROCESS FOR PRODUCTION OF SOLAR CELL MODULE

(75) Inventors: Hiroshi Hiraike, Shimamoto-cho (JP); Masahiro Asuka, Shimamoto-cho (JP); Masahiro Ishii, Shimamoto-cho (JP); Jiamo Guo, Shimamoto-cho (JP); Kiyomi Uenomachi, Shimamoto-cho (JP); Takahiko Sawada, Shimamoto-cho (JP); Takahiro Nomura, Shimamoto-cho (JP)

(73) Assignee: Sekisui Chemical Co., Ltd., Osaka (JP)

( * ) Notice: Subject to any disclaimer, the term of this patent is extended or adjusted under 35 U.S.C. 154(b) by 352 days.

(21) Appl. No.: 13/574,909

(22) PCT Filed: Jan. 26, 2011

(86) PCT No.: PCT/JP2011/051529
§ 371 (c)(1),
(2), (4) Date: Jul. 24, 2012

(87) PCT Pub. No.: WO2011/093351
PCT Pub. Date: Aug. 4, 2011

(65) Prior Publication Data
US 2013/0005071 A1 Jan. 3, 2013

(30) Foreign Application Priority Data

Jan. 26, 2010 (JP) ................. 2010-014125
Oct. 6, 2010 (JP) ................. 2010-226213

(51) Int. Cl.
*H01L 31/0203* (2014.01)
*H01L 31/048* (2014.01)
(Continued)

(52) U.S. Cl.
CPC ........ *H01L 31/048* (2013.01); *B29C 66/83413* (2013.01); *B32B 37/04* (2013.01);
(Continued)

(58) Field of Classification Search
USPC .......... 257/40, 433–434, 436, 464, 452, 622, 257/784; 438/64–66, 73; 136/159, 136/251–252, 256, 259; 428/220–221, 336, 428/412–413, 474, 480, 483
See application file for complete search history.

(56) References Cited

U.S. PATENT DOCUMENTS 5,728,230 A * 3/1998 Komori et al. ................. 136/251
6,320,115 B1 11/2001 Kataoka et al.
(Continued)

FOREIGN PATENT DOCUMENTS

CN 1146077 3/1997
CN 1198010 11/1998
(Continued)

OTHER PUBLICATIONS

International Search Report issued Mar. 1, 2011 in International (PCT) Application No. PCT/JP2011/51529, of which the present application is the national stage.
(Continued)

*Primary Examiner* — Dung Le
(74) *Attorney, Agent, or Firm* — Wenderoth, Lind & Ponack, L.L.P.

(57) ABSTRACT

The present invention provides a sealing material for a solar cell that seals a solar cell element of a solar cell in a short time in the production of a solar cell module, thereby enabling efficient production of solar cell modules. The sealing material for a solar cell of the present invention has a feature of containing 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group.

8 Claims, 3 Drawing Sheets

(51) Int. Cl.
  *B29C 65/00* (2006.01)
  *B32B 37/04* (2006.01)
  *C08J 5/12* (2006.01)
  *C08L 23/26* (2006.01)
  *C08K 5/5435* (2006.01)
  *C09K 3/10* (2006.01)
  *B29C 65/18* (2006.01)

(52) U.S. Cl.
  CPC ............... *C08J 5/128* (2013.01); *C08L 23/26* (2013.01); *C08K 5/5435* (2013.01); *C09K 3/10* (2013.01); *B29C 65/18* (2013.01); *B29C 66/1122* (2013.01); *B29C 66/433* (2013.01); *B29C 66/45* (2013.01); *B29C 66/71* (2013.01); *B23B 2457/12* (2013.01); *C08J 2423/26* (2013.01); *C08J 2427/12* (2013.01); *Y02E 10/50* (2013.01); *C09K 2200/0642* (2013.01)
  USPC ............... 257/433; 257/40; 257/787; 438/64; 438/66; 438/73; 136/251; 136/256; 136/259; 428/220; 428/447; 428/483

(56) References Cited

U.S. PATENT DOCUMENTS

| | | | |
|---|---|---|---|
| 6,414,236 B1 * | 7/2002 | Kataoka et al. | 136/251 |
| 2002/0014706 A1 | 2/2002 | Tanaka et al. | |
| 2006/0201544 A1 | 9/2006 | Inoue | |
| 2007/0251572 A1 | 11/2007 | Hoya et al. | |
| 2008/0302417 A1 | 12/2008 | Inoue et al. | |
| 2009/0165847 A1 | 7/2009 | Mori et al. | |

FOREIGN PATENT DOCUMENTS

| | | |
|---|---|---|
| CN | 101313046 | 11/2008 |
| EP | 1 065 731 | 1/2001 |
| EP | 1 712 604 | 10/2006 |
| EP | 1 956 660 | 8/2008 |
| JP | 11-026791 | 1/1999 |
| JP | 2002-235047 | 8/2002 |
| JP | 2004-214641 | 7/2004 |
| WO | 2006/057361 | 6/2006 |

OTHER PUBLICATIONS

European Search Report issued Nov. 10, 2014 in corresponding European Application No. 11737064.3.

* cited by examiner

SEALING MATERIAL FOR SOLAR CELL, PROTECTIVE SHEET FOR SOLAR CELL, AND PROCESS FOR PRODUCTION OF SOLAR CELL MODULE

TECHNICAL FIELD

The present invention relates to a sealing material for a solar cell, a protective sheet for a solar cell, and a process for production of a solar cell module.

BACKGROUND ART

Solar cell modules including semiconductor wafers made of silicon or selenium is produced by, while degassing, heating under reduced pressure a laminated body obtained by laminating sealing materials for a solar cell onto the top and bottom surfaces of a solar cell element including wafers of a silicon semiconductor element or selenium semiconductor element with a function to generate an electric current by irradiation of light, the wafers having been connected directly or in parallel with an interconnector, and superposing a transparent top side protective material on the top surface of the sealing materials for a solar cell and a bottom side protective material on the bottom surface of the sealing materials for a solar cell, thereby integrally laminating the protective materials to the top and bottom surfaces of the solar cell element via the sealing material for a solar cell. Also in solar cells having a structure where a solar cell element made of silicon or a compound semiconductor has been laminated in a thin film form onto a substrate, sealing materials for a solar cell as described above have been used for sealing solar cell elements.

With respect to the sealing material for a solar cell to be used for such a solar cell module, for example, Patent Document 1 has proposed a protective sheet for a solar cell module, the protective sheet being made of an ethylene copolymer containing an organic peroxide, wherein the organic peroxide comprises a dialkyl peroxide (A) and at least one peroxide (B) selected from the group consisting of alkyl peroxyesters and peroxyketals are compounded as organic peroxides at a weight ratio (A)/(B) of 10/90 to 90/10.

The above-mentioned protective sheet for a solar cell module is formed from an ethylene copolymer and contains an organic peroxide in order to impart heat resistance; a solar cell module has been produced by superposing a protective sheet for a solar cell module onto a solar cell element, thereby forming a laminated sheet or a laminated body, and then vacuum laminating the laminated sheet or the laminated body to heat it while pressing it in its thickness direction, thereby decomposing the organic peroxide in the protective sheet for a solar cell module to cause crosslinking of the ethylene copolymer, thereby imparting heat resistance thereto and at the same time, integrating the solar cell element to the protective sheet of a solar cell module.

Accordingly, if the crosslinking in the protective sheet for a solar cell module is performed unevenly, the heat resistance of the protective sheet for a solar cell module will partially become insufficient and there will be caused a problem that the durability of a solar cell module to be obtained deteriorates.

In order to prevent the occurrence of such a problem, instead of heating, in a conveyance state, a laminated sheet or a laminated body with a protective sheet for a solar cell module being superposed onto a solar cell element, it is necessary to cut the laminated sheet or the laminated body into a desired shape beforehand, then temporarily bond the laminated sheet or the laminated body in several minutes or several tens of minutes in a stationary state under the application of pressure in the thickness direction using a vacuum laminator, and then carry out a crosslinking step of fully bonding them in several tens of minutes to one hour by heating them to a temperature as high as the organic peroxide can decompose, which have resulted in a problem that the production efficiency of a solar cell module is low.

Although the above-mentioned protective sheet for a solar cell module is crosslinked with organic peroxide in order to impart heat resistance, this causes a problem that it becomes impossible to produce a protective sheet for a solar cell module due to the occurrence of the decomposition of the organic peroxide during the production of the protective sheet for a solar cell module or the adhesive property of the protective sheet for a solar cell module decreases, or a problem that a decomposition product derived from the organic peroxide is formed in a adhesive interface, so that the adhesive property of the protective sheet for a solar cell module decreases.

In other words, since solar cell elements are precision components, there may be arisen a problem that gas derived from decomposition products of organic peroxides is generated from a protective sheet for a solar cell module during the production or use of a solar cell module, so that the cell performance of a solar cell deteriorates.

PRIOR ART DOCUMENT

Patent Document

Patent Document 1: JP 11-26791 A

SUMMARY OF THE INVENTION

Problems to be Solved by the Invention

The present invention provides a sealing material for a solar cell that seals a solar cell element of a solar cell in a short time in the production of a solar cell module, thereby enabling efficient production of solar cell modules; a protective sheet for a solar cell using the same; and a process for production of a solar cell module.

Means for Solving the Problems

The sealing material for a solar cell of the present invention has a feature of containing 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group.

The modified butene-based resin constituting the sealing material for a solar cell of the present invention is a material obtained by graft-modifying a butene-ethylene copolymer with maleic anhydride. The content of butene in the butene-ethylene copolymer is limited to 1 to 25% by weight and is preferably 10 to 20% by weight because if it is low, the flexibility of the sealing material for a solar cell will decrease and, as a result, heating at high temperature will be required in the sealing of a solar cell element using the sealing material for a solar cell, whereas if it is high, the crystallinity or flowability of the sealing material for a solar cell will become uneven to cause strain in the sealing material for a solar cell, so that the adhesive property of the sealing material for a solar cell will decrease.

The content of butene in the butene-ethylene copolymer can be calculated from a spectrum integral derived from a 1-butene structure and a spectrum integral derived from an ethylene structure each determined by dissolving the butene-ethylene copolymer in deuterated chloroform and then measuring a $^{13}$C-NMR spectrum (nuclear magnetic resonance spectrum). The spectrum derived from the 1-butene structure is usually detected near 10.9 ppm, near 26.1 ppm, and near 39.1 ppm, and the spectrum derived from the ethylene structure is usually detected near 26.9 ppm, near 29.7 ppm, near 30.2 ppm, and near 33.4 ppm. As to the assignment of a $^{13}$C-NMR spectrum, Macromolecular Analysis Handbook [edited by The Japan Society for Analytical Chemistry, published by Asakura Publishing Co., Ltd. (2008), pages 1101-1109] can be used for reference.

The total content of maleic anhydride in the modified butene-based resin is limited to 0.1 to 3% by weight and is preferably 0.15 to 1.5% by weight, and more preferably 0.15% by weight or more and less than 1.0% by weight because if it is low, the adhesive property of the sealing material for a solar cell may decrease, whereas if it is high, the modified butene-based resin may be crosslinked, so that the adhesive property of the sealing material for a solar cell may decrease or the extrusion formability of the sealing material for a solar cell may decrease.

The total content of maleic anhydride in the modified butane-based resin can be calculated from the intensity of absorption near 1790 cm$^{-1}$ detected by preparing a test film from a modified butene-based resin that constitutes a sealing material for a solar cell and then measuring the infrared absorption spectrum of this test film. Specifically, the total content of maleic anhydride in the modified butene-based resin can be measured by, for example, the method disclosed in Macromolecular Analysis Handbook [edited by The Japan Society for Analytical Chemistry, published by Asakura Publishing Co., Ltd. (2008), pages 152-154)] by using an FT-IR (Fourier transform infrared spectrophotometer, Nicolet 6700 FT-IR).

Although the modified butene-based resin is a material obtained by graft-modifying a butene-ethylene copolymer having a prescribed butene content with maleic anhydride, commonly used procedures can be used in the method of the graft-modification. Examples thereof include (1) a melt modification method that involves feeding a butene-ethylene copolymer, maleic anhydride, and a radical polymerization initiator to an extruder, melt-kneading them therein, and thereby graft-polymerizing the maleic anhydride to the butene-ethylene copolymer, and (2) a solution modification method that involves preparing a solution by dissolving a butene-ethylene copolymer in a solvent, adding maleic anhydride and a radical polymerization initiator to the solution, and then graft-polymerizing the maleic anhydride to the butene-ethylene copolymer; and the melt modification method (1) is preferred.

Alternatively, it is also permitted to produce a modified butene-based resin having maleic anhydride in a total content of 0.1 to 3% by weight by producing a modified butene-ethylene copolymer having maleic anhydride in a total content of more than 3% by weight by the above-described melt modification method or in the same procedures as the above-described melt modification method, then, in order to adjust the total content of maleic anhydride in the modified butene-ethylene copolymer, adding a butene-ethylene copolymer unmodified with maleic anhydride to the modified butene-ethylene copolymer and mixing them, thereby adjusting the total content of maleic anhydride.

The radical polymerization initiator is not particularly restricted as far as it is one that has been conventionally used for radical polymerization, and examples thereof include benzoyl peroxide, cumene hydroperoxide, diisopropyl peroxydicarbonate, cumyl peroxyneodecanoate, cumyl peroxyoctoate, and azobisisobutyronitrile.

The maximum peak temperature (Tm) of the endothermic curve measured by differential scan calorimetric analysis in the modified butene-based resin is preferably 80 to 125° C., and more preferably 83 to 110° C. because if it is low, the heat resistance of the sealing material for a solar cell may deteriorate, whereas if it is high, the time of heating the sealing material for a solar cell may become long in producing a solar cell module by sealing a solar cell element with the sealing material for a solar cell and, as a result, the productivity of solar cell modules may decrease or the sealing of a solar cell element may become insufficient due to insufficient heating of the sealing material for a solar cell.

In the present invention, the endothermic curve obtained by differential scan calorimetric analysis in a synthetic resin is measured in accordance with the method of measurement provided to JIS K7121.

The melt flow rate of the modified butene-based resin is preferably 0.5 to 29 g/10 minutes, and more preferably 2 to 10 g/10 minutes because if it is low, the extrusion formability of the sealing material for a solar cell may decrease, whereas if it is high, the extrusion formability of the sealing material for a solar cell may decrease, so that the thickness accuracy of the sealing material for a solar cell may decrease. The melt flow rate of a modified butene-based resin means a value measured in accordance with ASTM D1238 under a load of 2.16 kg.

The viscoelastic storage modulus at 30° C. of the modified butene-based resin is preferably $2 \times 10^8$ Pa or lower because if it is high, the flexibility of the sealing material for a solar cell decreases, resulting in deterioration of handleability, or it may become necessary to rapidly heat the sealing material for a solar cell in producing a solar cell module by sealing a solar cell element with the sealing material for a solar cell; it is more preferably $1 \times 10^7$ to $1.5 \times 10^8$ Pa because if it is excessively low, the sealing material for a solar cell may exhibit tackiness at room temperature, so that the handleability of the sealing material for a solar cell may decrease.

The viscoelastic storage modulus at 100° C. of the modified butene-based resin is preferably $5 \times 10^6$ Pa or lower because if it is high, the adhesive property of the sealing material for a solar cell may decrease; it is more preferably $1 \times 10^4$ to $4 \times 10^6$ Pa because if it is excessively low, in producing a solar cell module by sealing a solar cell element with the sealing material for a solar cell, the sealing material for a solar cell flows greatly due to pressing force, so that the thickness of the sealing material for a solar cell may become highly uneven.

In the present invention, the viscoelastic storage modulus of a modified butene-based resin means a value measured by the testing method of dynamic properties in accordance with JIS K6394.

The sealing material for a solar cell contains a silane compound having an epoxy group. If the sealing material for a solar cell used in a solar cell module contains maleic anhydride or maleic acid remaining unused for graft modification, there is a fear that the maleic anhydride or the maleic acid corrodes components contained in the solar cell module, such as electrodes and wires, so that the power generation performance of the solar cell module is deteriorated. Especially, in the case where a solar cell module obtained by using the sealing material for a solar cell is allowed to stand under a high-temperature and high-humidity environment for a long term, there is a feat that maleic anhydride or maleic acid is formed through hydrolysis of the modified butene-based resin contained in the sealing material for a solar cell.

However, the silane compound having an epoxy group can capture maleic anhydride through an addition reaction of the epoxy group of the silane compound with maleic anhydride or maleic acid, and accordingly, it becomes possible to highly suppress components such as electrodes and wires from being corroded by maleic anhydride or maleic acid.

The silane compound may have at least one epoxy group, such as an aliphatic epoxy group or an alicyclic epoxy group, in the molecule thereof. Preferred examples of such a silane compound having an epoxy group include silane compounds represented by the following general formula (I):

[Chemical Formula 2]

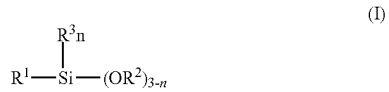

(I)

wherein $R^1$ represents a 3-glycidoxypropyl group or a 2-(3,4-epoxycyclohexyl)ethyl group, $R^2$ represents an alkyl group having 1 to 3 carbon atoms, $R^3$ represents an alkyl group having 1 to 3 carbon atoms, and n is 0 or 1.

$R^1$ given above represents a 3-glycidoxypropyl group represented by the following chemical formula (II) or a 2-(3,4-epoxycyclohexyl)ethyl group represented by the following chemical formula (III):

[Chemical Formula 3]

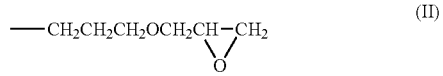

(II)

[Chemical Formula 4]

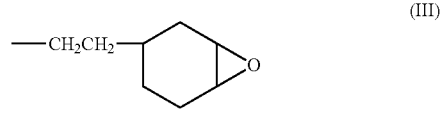

(III)

$R^2$ given above is not particularly restricted as far as it is an alkyl group having 1 to 3 carbon atoms and examples thereof include a methyl group, an ethyl group, and a propyl group; a methyl group and an ethyl group are preferred, and a methyl group is more preferred.

$R^3$ given above is not particularly restricted as far as it is an alkyl group having 1 to 3 carbon atoms and examples thereof include a methyl group, an ethyl group, and a propyl group; a methyl group is preferred.

Examples of the silane compound represented by the general formula (I) given above include 3-glycidoxypropylmethyldimetoxysilane, 3-glycidoxypropyl methyldiethoxysilane; 3-glycidoxypropyltrimetoxysilane, 3-glycidoxypropyltriethoxysilane, 3-glycidoxypropyltripropoxysilane, 2-(3,4-epoxycyclohexyl)ethyltrimethoxysilane, 2-(3,4-epoxycyclohexyl)ethyltriethoxysilane, and 2-(3,4-epoxycyclohexyl)ethyltripropoxysilane.

Compounds of the general formula (I) given above wherein n is 0 are preferred. 3-Glycidoxypropyltrimetoxysilane is particularly preferred as the silane compound.

The content of the above-described silane compound in the sealing material for a solar cell is limited to 0.1 to 15 parts by weight and is preferably 0.1 to 1.5 parts by weight based on 100 parts by weight of the modified butene-based resin because if it is low, the adhesive property of the sealing material for a solar cell may decrease, whereas if it is high, the adhesive property of the sealing material for a solar cell will rather decrease.

In addition, the sealing material for a solar cell may contain additives, such as light stabilizers, UV absorbers, and heat stabilizers, unless the physical properties thereof are impaired.

The sealing material for a solar cell may be also used as a protective sheet for a solar cell by integrally laminating a fluoropolymer sheet onto one surface of the sealing material for a solar cell. Examples of the fluoropolymer that constitutes such a fluoropolymer sheet include polytetrafluoroethylene, polychlorotrifluoroethylene, polyvinylidene fluoride, polyvinyl fluoride, perfluoroalkoxy fluoropolymers, tetrafluoroethylene-hexafluoropropylene copolymers, ethylene-tetrafluoroethylene copolymers, and ethylene-chlorotrifluoroethylene copolymers; and polyvinylidene fluoride is preferred.

Next, a process for production of the above-described sealing material for a solar cell will be described. The process for production of the sealing material for a solar cell is not particularly restricted and examples thereof include a process in which a sealing material for a solar cell is produced by feeding a modified butene-based resin, a silane compound having an epoxy group, and an additive added if necessary in prescribed weight proportions to an extruder, followed by melting, kneading, and extruding into a sheet form from the extruder.

In the case where such an additive added if necessary is used in the above-described process, the additive may be used in the form of a masterbatch containing it. For example, it is also permitted to produce a sealing material for a solar cell by adding an additive in a high concentration to a polyolefin-based resin to prepare a masterbatch, and then feeding the masterbatch, a modified butene-based resin, and a silane compound having an epoxy group in prescribed weight proportions to an extruder, followed by melting, kneading, and extruding into a sheet-like form from the extruder. By using a masterbatch in this manner, it is possible to provide a sealing material for a solar cell in which an additive has been dispersed to a high degree.

Examples of the polyolefin-based resin to be used for the masterbatch include polyethylene-based resins, such as low density polyethylene, medium density polyethylene, high density polyethylene, and ethylene-α-olefin copolymers containing ethylene in an amount exceeding 50% by weight, such as linear low density polyethylene, and polypropylene-based resins, such as homopolypropylene and propylene-α-olefin copolymers containing propylene in an amount exceeding 50% by weight. Examples of the α-olefin to be copolymerized with ethylene include propylene, 1-butene, 4-methyl-1-pentene, 1-hexene, and 1-octene. Examples of the α-olefin to be copolymerized with propylene include ethylene, 1-butene, 4-methyl-1-pentene, 1-hexene, and 1-octene. Especially, as the polyolefin-based resin, polyethylene-based resins are preferred, low density polyethylene is more preferred, and linear low density polyethylene is more preferred.

The density of low density polyethylene is preferably 0.80 to 0.93 g/cm³, and more preferably 0.89 to 0.925 g/cm³. In the present invention, the density of low density polyethylene means a density measured in accordance with JIS K7112.

The method for integrally laminating a fluoropolymer sheet onto one surface of the sealing material for a solar cell is not particularly restricted and examples thereof include a method involving extrusion-laminating a fluoropolymer sheet onto one surface of a sealing material for a solar cell and a method involving co-extruding a sealing material for a solar cell and a fluoropolymer sheet.

Subsequently, a procedure to produce a solar cell module using the above-described sealing material for a solar cell will be described. Unlike conventional sealing materials for a solar cell, the sealing material for a solar cell of the present invention is not required to secure a time necessary for heating in order to decompose organic peroxides and crosslinking a resin and therefore it can seal solar cell elements in a short time.

Especially, it is possible to perform the sealing of a solar cell element of a solar cell in which a film-like solar cell element made of silicon, a compound semiconductor or the like has been formed on a flexible elongate substrate by roll-to-roll and thereby is possible to increase the production efficiency of solar cell modules.

Specifically, as illustrated in FIG. 1, there is prepared a solar cell A in which a film-like solar cell element 2 capable of generating electricity by irradiation of light has been formed on a flexible elongate substrate 1. The flexible elongate substrate is not particularly restricted and examples thereof include sheets made of heat-resistant resins such as polyimide, polyetheretherketone, and polyethersulfone. The film-like solar cell element 2 is formed by procedures generally used from crystalline semiconductors such as single crystal silicon, single crystal germanium, polycrystal silicon, and microcrystal silicon, amorphous semiconductors such as amorphous silicon, compound semiconductors such as GaAs, InP, AlGaAs, CdS, CdTe, $Cu_2S$, $CuInSe_2$, and $CuInS_2$, organic semiconductors such as phthalocyanine and polyacetylene, or the like. On the top and bottom surfaces of the film-like solar cell element, electrodes each made of a layer of silicon oxide such as silicon dioxide, an indium-tin-oxide (ITO) layer, a zinc-oxide (ZnO) layer, and the like are formed.

As illustrated in FIG. 2, the elongate solar cell A has been wound into a roll and the above-mentioned elongate sealing material for a solar call B also has been wound into a roll; the solar cell A and the sealing material for a solar cell B are wound off and the sealing material for a solar cell B is laminated onto the substrate 1 of the solar cell A with the sealing material for a solar cell B being opposed to the solar cell element 2, so that a laminated sheet C is formed; then the laminated sheet C is fed to between a pair of rolls D, D heated to a prescribed temperature and the laminated sheet C is heated while the laminated sheet C is pressed in the thickness direction thereof, so that the sealing material for a solar cell B is adhesively attached onto the substrate 1 of the solar cell A; thereby the solar cell element 2 is sealed, so that a solar cell module E can be produced continuously.

In the case where a protective sheet for a solar cell B' in which a fluoropolymer sheet B1 has been laminated integrally onto one surface of the sealing material for a solar cell B is used, the solar cell module E can be produced by laminating the Protective sheet for a solar cell B' onto the solar cell element 2 of the solar cell A with the sealing material for a solar cell B being opposed to the solar cell element 2; a solar cell module capable of generating electricity stably for a long term can be obtained because the fluoropolymer sheet B1, which is superior in gas barrier properties, has been laminated as a protective material integrally onto the outermost layer of the solar cell module (see FIG. 3).

As described above, since the sealing material for a solar cell B of the present invention has superior heat resistance without having been subjected to crosslinking with an organic peroxide, it is unnecessary to strictly control the heating of the sealing material for a solar cell B; as described above, it is possible to surely seal the solar cell element 2 with the sealing material for a solar cell B by performing a simple step of superposing the sealing material for a solar cell B onto the solar cell element 2 of the solar cell A, and heating them under pressure for adhesively combining them, so that it is possible to produce a solar cell module that is stable for a long term.

There has been described the case where a solar cell module is produced by sealing only the surface of the substrate 1 of the solar cell A where the solar cell element 2 is formed with the sealing material for a solar cell B. However, as illustrated in FIG. 4, a solar cell module may be also produced by sealing the solar cell A with the sealing materials for a solar cell B, B from both the top and bottom surfaces of the solar cell A.

Specifically, a elongate solar cell A having been rolled up is prepare and two elongate sealing materials for a solar cell B having been rolled up are also prepared. Then, the elongate sealing materials for a solar cell B, B are wound off, the elongate solar cell A is also wound off, and then the sealing materials for a solar cell B, B are superposed via the solar cell A to form a laminated sheet C. Thereafter, the laminated sheet C is fed to between a pair of rolls D, D heated to a prescribed temperature and the sealing materials for a solar cell B, Bare adhesively attached to each other by heating the laminated sheet C while pressing the laminated sheet C in the thickness direction thereof, so that the solar cell A is sealed with the sealing materials for a solar cell B, B. Thus, a solar cell module E can be produced continuously. It is also permitted to form the laminated sheet C by superposing the sealing materials for a solar cell B, B via the solar cell A and, at the same time, heat the laminated sheet C while pressing the laminated sheet C in the thickness direction thereof. In the case where a protective sheet for a solar cell B' in which a fluoropolymer sheet B1 has been laminated integrally onto one surface of the sealing material for a solar cell B is used, it is recommendable in the above-described production process to use the protective sheet for a solar cell B' instead of the sealing material for a solar cell B and superpose the protective sheets for a solar cell B', B' with their sealing materials for a solar cell B, B being opposite to each other. In this case, the fluoropolymer sheet B1 of any one of the protective sheets for a solar cell B', B' serves as a transparent top side protective material and the fluoropolymer sheet B1 of the other protective sheet for a solar cell B' serves as a bottom side protective material.

There has been described the case where a solar cell module is produced continuously while the elongate solar cell A is wound off. However, the solar cell A is not required to be elongate and may be also a solar cell A in which a film-like solar cell element 2 capable of generating electricity by irradiation of light has been formed on a sheet-like and flexible substrate 1 having a rectangular form or the like. In the case where such a solar cell A is used, as illustrated in FIG. 5, two elongate sealing materials for a solar cell B having been rolled up are prepared. Then, the elongate sealing materials for a solar cell B, B are wound off, the solar cell A is fed to between the sealing materials for a solar cell B, B at prescribed time intervals, and then the sealing materials for a solar cell B, B are superposed via the solar cell A to form a laminated sheet C. Thereafter, the laminated sheet C is fed to between a pair of rolls D, D heated to a prescribed temperature and the sealing materials for a solar cell B, B are adhesively attached to each other by heating the laminated sheet C while pressing the laminated sheet C in the thickness direction thereof, so that the solar cell A is sealed with the sealing materials for a solar cell B, B. Thus, a solar cell module E can be produced continuously. In the case where a protective sheet for a solar cell B' in which a fluoropolymer sheet B1 has been laminated integrally onto one surface of the sealing material for a solar cell B is used, it is recommendable in the above-described production process to use the protective sheet for a solar cell B' instead of the sealing material for a solar cell B and superpose the protective sheets for a solar cell B', B' with their sealing materials for a solar cell B, B being opposite to each other. In this case, the fluoropolymer sheet B1 of any one of the protective sheets for a solar cell B', B' serves as a transparent top side protective material and the fluoropolymer sheet B1 of the other protective sheet for a solar cell B' serves as a bottom side protective material.

There has been described the case where a solar cell in which a film-like solar cell element 2 capable of generating electricity by irradiation of light has been formed on a flexible substrate 1 is used as the solar cell. However, the sealing material for a solar cell of the present invention can be also used as a sealing material of a solar cell or a solar cell module having a constitution other than the constitution as described above. Examples of such a solar cell include (1) a solar cell in which a film-like solar cell element capable of generating electricity by irradiation of light has been formed on a substrate without flexibility such as a glass plate, and (2) a solar cell in which solar cell elements made of silicon semiconductor elements or selenium semiconductor elements, which have a function to generate an electric current on irradiation of light, have been connected directly or in parallel using an interconnector.

In the case of a solar cell having the above-described constitution (1), when a solar cell module is produced by sealing only the surface in the substrate of the solar cell where a solar cell element is formed with a sealing material for a solar cell, in the same manner as in the case of the solar cell in which a film-like solar cell element capable of generating electricity by irradiation of light has been formed on a flexible substrate, the solar cell module can be produced by laminating the sealing material for a solar cell onto the solar cell with the sealing material for a solar cell being opposite to a semiconductor element to produce a laminated sheet, and then feeding the laminated sheet to between a pair of rolls and pressing the sheet in its thickness direction while heating, thereby integrally laminating the sealing material for a solar cell onto one surface of the substrate of the solar cell and thereby sealing the solar cell element.

Moreover, in the case of the solar cell having the above-described constitution (1), when a solar cell module is produced by sealing the top and bottom surfaces of the solar cell with sealing materials for a solar cell, in the same manner as in the case of the solar cell in which a film-like solar cell element capable of generating electricity by irradiation of light has been formed on a flexible substrate, the solar cell module can be produced by feeding the solar cell to between the sealing materials for a solar cell to produce a laminated sheet, and then feeding the laminated sheet to between a pair of rolls and pressing the sheet in its thickness direction while heating, thereby adhesively attaching the sealing materials for a solar cell to each other and thereby sealing the solar cell with the sealing materials for a solar cell from the top and bottom thereof.

In the case of a solar cell having the above-described constitution (2), a solar cell module can be also produced by a process in which a laminated body is produced by laminating a transparent top side protective material 4 to the top surface of a solar cell 3 via a sealing material for a solar cell B and laminating a bottom side protective material 5 to the bottom surface of the solar cell 3 via the sealing material for a solar cell B, and then the solar cell 3 is sealed with the sealing materials for a solar cell B, B, preferably under reduced pressure, by heating the laminated body under application of pressing force in the thickness direction thereof (see FIG. 6).

Examples of the above-described transparent top side protective layer 4 include a glass substrate such as silicate glass, and a fluoropolymer sheet. Examples of the bottom side protective material 5 include plastic sheets, such as a fluoropolymer sheet, a polyethylene terephthalate (PET) sheet, a polyethylene naphthalate (PEN) sheet, and a polyethylene butyrate sheet. Examples of the fluoropolymer sheet include fluoropolymer sheets that are the same as those to be used for the protective sheet for a solar cell described above. Especially, it is preferable to use a fluoropolymer sheet as the transparent top side protective material 4 and the bottom side protective material 5, and the use of a polyvinylidene fluoride sheet is more preferable.

In the above-described process, in the case where a protective sheet for a solar cell in which a fluoropolymer sheet has been integrally laminated onto one surface of the sealing material for a solar cell B is used, a solar cell module can be produced by a process in which a laminated body is produced by laminating a first protective sheet for a solar cell in which a fluoropolymer sheet as the transparent top side protective material has been integrally laminated onto one surface of the sealing material for a solar cell to the top surface of the solar cell with the solar cell being opposed to the sealing material for a solar cell, and laminating a second protective sheet for a solar cell in which a fluoropolymer sheet as the bottom side protective material has been integrally laminated onto one surface of the sealing material for a solar cell to the bottom surface of the solar cell with the solar cell being opposed to the sealing material for a solar cell, and then the solar cell 3 is sealed with the sealing materials for a solar cell B, B, preferably under reduced pressure, by heating the laminated body under application of pressing force in the thickness direction thereof.

Before heating the laminated body under application of pressing force in the thickness direction thereof, it is preferable to perform a degassing step of removing gas contained in the laminated body by heating the laminated body to a prescribed temperature beforehand. In the degassing step, it is unnecessary to apply pressing force to the laminated body in the thickness direction thereof when heating the laminated body.

In the degassing step, the laminated body is preferably heated to 40° C. or higher and lower than 100° C., and more preferably 80° C. or higher and lower than 100° C. If the temperature of heating the laminated body in the degassing step is excessively high, the gas contained in the laminated body may not be removed sufficiently, whereas if it is excessively low, the time required for sufficiently removing gas from the laminated body in the degassing step may become long.

The time of heating the laminated body in the degassing step is preferably 1 to 10 minutes, and more preferably 2 to 5 minutes. If the time of heating the laminated body in the degassing step is excessively short, the gas contained in the laminated body may not be removed sufficiently, whereas if it is excessively long, the time required for sufficiently removing gas from the laminated body in the degassing step may become long.

Next, in heating the layered body under application of pressing force in the thickness direction thereof, it is preferable to heat the laminated body to 100 to 130° C., and more preferably 100 to 120° C. The time of heating the laminated body under application of pressing force in the thickness direction thereof is preferably 1 to 10 minutes, and more preferably 2 to 5 minutes.

The step of heating the laminated body under application of pressing force in the thickness direction thereof is preferably performed under a reduced pressure of 1000 Pa or lower, and more preferably under a reduced pressure of 80 to 1000 Pa. By heating the laminated body under reduced pressure in this manner, a solar cell module can be obtained without generation of warpage in the resulting solar cell module or generation of wrinkles or bubbles in the sealing material for a solar cell.

The degassing step that involves heating the laminated body to a prescribed temperature beforehand and the step of heating the laminated body under application of pressing force in the thickness direction thereof can be carried out by using such a conventional apparatus as a vacuum laminator.

By the above-described process in which a solar cell module is produced by heating, under application of pressure, the laminated body in which the sealing material for a solar cell B has been disposed on both surfaces of the solar cell 3, it is possible to surely seal the solar cell 3 with the sealing material for a solar cell B even if the time of heating the laminated body is shortened. Accordingly, by the above-described process, the time necessary for a sealing step of sealing the solar cell 3 with the sealing material for a solar cell B can be shortened and therefore it is possible to efficiently produce a solar cell module capable of exhibiting power generation performance stably for a long term. In addition, in the above-described process, it is unnecessary to strictly control the temperature of heating the laminated body because the sealing material for a solar cell B contains no organic peroxide and it is possible to surely seal the solar cell 3 with the sealing material for a solar cell B even if the temperature of heating the laminated body is set low. Moreover, even if the laminated body is heated under reduced pressure, the sealing material for a solar cell B is suppressed from squeezing out from a side surface of the laminated body due to its melting and flowing, and accordingly there is no fear that the above-mentioned sealing material for a solar cell B deteriorates the appearance quality or power generation performance of the solar cell module.

There has been described the case where a solar cell module is produced using the solar cell with the above-described constitution (2) as the solar cell. However, it is also permitted to use a solar cell A in which a film-like solar cell element capable of generating electricity by irradiation of light has been formed on a sheet-like and flexible substrate having a rectangular form or the like, or a solar cell A in which a film-like solar cell element capable of generating electricity by irradiation of light has been formed on a sheet-like and non-flexible substrate having a rectangular form or the like instead of using the solar cell with the above-described constitution (2) (see FIG. 7).

Effect of the Invention

The sealing material for a solar cell of the present invention has the constitution as described above and is not required to contain an organic peroxide; in producing a solar cell module by sealing a solar cell element, it is unnecessary to strictly control the heating of the sealing material for a solar cell for controlling the decomposition of the organic peroxide, and the sealing of the solar cell element can be carried out surely and simply by attaching the sealing material for a solar cell to the solar cell element under pressure while heating the sealing material for a solar cell or by bringing the sealing materials for a solar cell provided on the top and bottom surfaces of the solar cell into firm contact with each other.

Especially, in the case where the sealing of a solar cell element of a solar cell in which a film-like solar cell element has been formed on a flexible substrate is carried out, it is possible to efficiently produce a solar cell module easily and efficiently with roll-to-roll by performing the sealing of the solar cell element in such an easy procedure that the solar cell rolled up is wound off, the sealing material for a solar cell rolled up is also wound off, and the sealing material for a solar cell is laminated onto a surface in the substrate of the solar cell where the solar cell element is formed, so that a laminated sheet is formed, and then the laminated sheet is fed to between a pair of rolls and attached under pressure in its thickness direction while being heated.

Moreover, even if a solar cell module is produced by sealing a solar cell with a sealing material for a solar cell by vacuum laminating a laminated body in which the sealing material for a solar cell has been laminated onto the top and bottom surfaces of the solar cell, the time necessary for this sealing step can be shortened, and it is unnecessary to strictly control the heating of the laminated body. Therefore, a solar cell module can be produced efficiently also by the above-described process. Furthermore, it is possible to highly suppress the sealing material for a solar cell from squeezing out from a side surface of the laminated body even if the heating of the laminated body under reduced pressure is carried out.

Since the sealing material for a solar cell of the present invention contains no organic peroxide as described above, production efficiency can be improved by increasing the extrusion rate during the production and there is no fear that generation of gas caused by organic peroxides occurs from the sealing material for a solar cell even after the mounting of the sealing material for a solar cell into a solar cell module. Moreover, because of the fact that the sealing material for a solar cell of the present invention contains a silane compound having an epoxy group, components such as electrodes and wires, provided within a solar cell module can be highly suppressed from being corroded by maleic anhydride or maleic acid even if the sealing material for a solar cell contains free maleic anhydride or free maleic acid remaining unused for graft modification. Therefore, the sealing material for a solar cell of the present invention can maintain high cell performance of a solar cell module for a long term.

MODE FOR CARRYING OUT THE INVENTION

Figure 1:
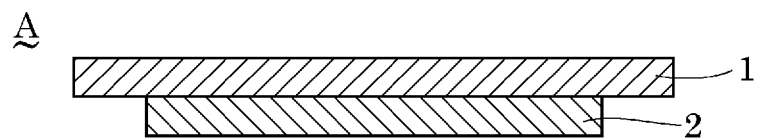
FIG. 1 is a vertical sectional view illustrating an exemplary solar cell.
Figure 2:
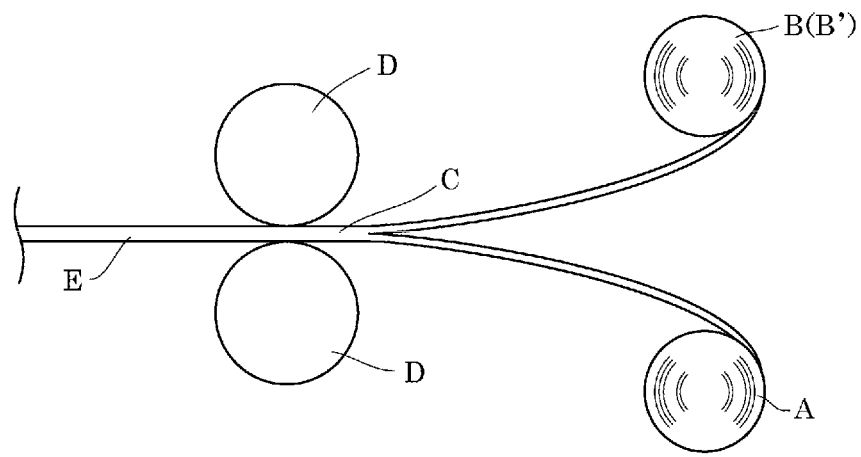
FIG. 2 is a schematic view illustrating an exemplary procedure of the production of a solar cell module using the sealing material for a solar cell of the present invention.
Figure 3:
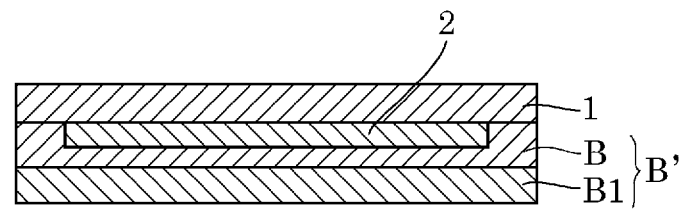
FIG. 3 is a schematic vertical sectional view illustrating an exemplary solar cell module using the sealing material for a solar cell of the present invention.

Aspects of the present invention will be hereafter further described with reference to examples, but the invention is not limited to only these examples.

EXAMPLE 1 to 16, COMPARATIVE EXAMPLES 1, 2, 6 to 7, and 10 to 14

While a composition for a sealing material for a solar cell containing 100 parts by weight of a modified butene-based resin prepared by graft-modifying a butene-ethylene copolymer having a prescribed butene content and a prescribed ethylene content given in Tables 1 to 4 with maleic anhydride and a prescribed amount given in Tables 1 to 4 of 3-glydoxypropyltrimethoxysilane (produced by Dow Corning Toray Co., Ltd.; trade name "Z-6040) or 3-acryloxypropyltrimethoxysilane (produced by Shin-Etsu Chemical Co., Ltd.; trade name "KBM-5103") as a silane compound was fed into a first extruder and then melt-kneaded at 230° C., polyvinylidene fluoride (produced by ARKEMA; trade name "Kynar 720") was fed into a second extruder and then melt-kneaded at 230° C. The composition for a sealing material for a solar cell and the polyvinylidene fluoride were fed to a joining die to which both the first extruder and the second extruder were connected, thereby being joined and then extruded into a sheet form through a T-shaped die connected to the joining die, so that an elongate protective sheet for a solar cell with a fixed width was obtained in which a 0.03-mm thick polyvinylidene fluoride sheet was integrally laminated onto one surface of a 0.2-mm thick sealing material for a solar cell made of the composition for a sealing material for a solar cell. The melt flow rate, maximum peak temperature (Tm) of the endothermic curve measured by differential scan calorimetric analysis, and viscoelastic storage modules at 30° C. and 100° C. of the modified butene-based resins were provided in Tables 1 to 4. The total contents of maleic anhydride in the modified butene-based resins were also given in Tables 1 to 4.

The modified butene-based resin used in Example 1 and Comparative Examples 1, 2, and 7 was marketed under the trade name "ADMER XE070" from Mitsui Chemicals, Inc.

COMPARATIVE EXAMPLE 3

A protective sheet for a solar cell was obtained in the same manner as in Example 1 except for using polyethylene instead of the modified butene-based resin.

COMPARATIVE EXAMPLES 4 and 8

Protective sheets for a solar cell were obtained in the same manner as in Example 1 except for using the prescribed amounts given in Tables 3 and 4 of modified polyethylenes graft-modified with maleic anhydride instead of the modified butene-based resin and using the prescribed amount given in Table 4 of 3-glydoxypropyltrimethoxysilane.

COMPARATIVE EXAMPLE 5

A protective sheet for a solar cell was obtained in the same manner as in Example 1 except for using a butene-ethylene copolymer not having been graft-modified with maleic anhydride and having the prescribed butene content and ethylene content given in Tables 3 and 4 instead of the modified butene-based resin.

COMPARATIVE EXAMPLE 9

A protective sheet for a solar cell was obtained in the same manner as in Example 1 except for using an ethylene-vinyl acetate copolymer (vinyl-acetate content: 28% by weight) instead of the modified butene-based resin and using the prescribed amount given in Table 4 of 3-glydoxypropyltrimethoxysilane.

COMPARATIVE EXAMPLE 15

A protective sheet for a solar cell was obtained in the same manner as in Example 1 except for using, instead of the modified butene-based resin, a terpolymer (produced by ARKEMA; Lotader HX8140) obtainable by radically polymerizing 77.2 parts by weight of ethylene, 20 parts by weight of ethyl acrylate, and 2.8 parts by weight of maleic anhydride. In Tables 1 to 10 provided below, this terpolymer is indicated by an abbreviation "EEAM."

COMPARATIVE EXAMPLE 16

A resin composition containing 100 parts by weight of an ethylene-vinyl acetate copolymer (vinyl acetate content: 28% by weight), 0.35 parts by mass of organic peroxide 1 (tert-butylperoxy-2-ethylhexyl monocarbonate), 0.5 parts by mass of a crosslinking aid (triallyl isocyanurate), and 0.5 parts by weight of a silane coupling agent (3-methacryloxypropyltrimethoxysilane) was fed to an extruder, melt-kneaded at 90° C., and then extruded at 90° C. through a T-shaped die attached to the tip of the extruder, so that a 0.2-mm thick sealing material for a solar cell was obtained.

(Preparation of Solar Cell Module: Roll-to-Roll)

Solar cell modules E were produced in the following procedure using the protective sheets for a solar cell produced in Examples 1 to 16 and Comparative Examples 1 to 15. First, while there was prepared a solar cell A as illustrated in FIG. 1 that had been obtained by forming a film-like solar cell element 2 on a substrate 1 made of a flexible polyimide film and that had been wound into a roll, two protective sheets for a solar cell B' wound into a roll were prepared.

Figure 4:
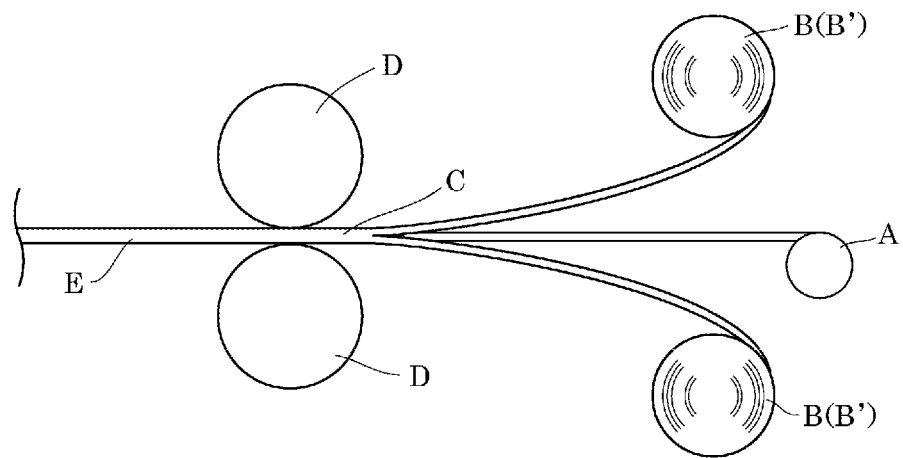
FIG. 4 is a schematic view illustrating an exemplary procedure of the production of a solar cell module using the sealing material for a solar cell of the present invention.
Figure 5:
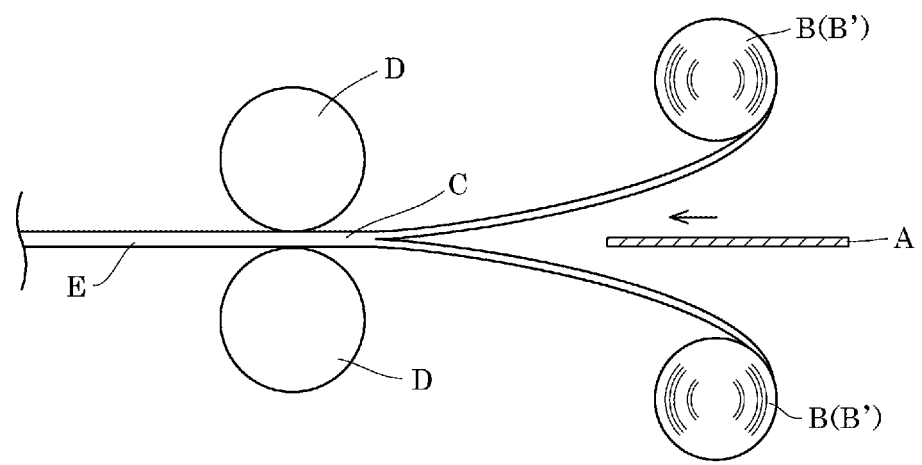
FIG. 5 is a schematic view illustrating an exemplary procedure of the production of a solar cell module using the sealing material for a solar cell of the present invention.
Figure 6:
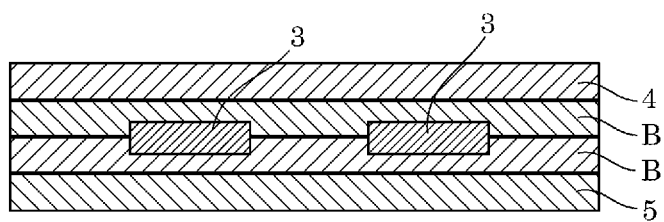
FIG. 6 is a schematic vertical sectional view illustrating another exemplary solar cell module using the sealing material for a solar cell of the present invention.

Subsequently, as illustrated in FIG. 4, the solar cell A and the two protective sheets for a solar cell. B', B' were wound off and sealing materials for a solar cell B', B' were superposed via the solar cell A, so that a laminated sheet C was formed. The sealing materials for a solar cell B', B' were superposed with their sealing materials for a solar cell being opposed to each other. Thereafter, the laminated sheet C was fed to between a pair of rolls D, D heated to 140° C. under an atmosphere without applying pressure nor reducing pressure and then the laminated sheet C was heated while the laminated sheet C was pressed in its thickness direction, so that the sealing materials for a solar cell B, B of the protective sheets for a solar cell B', B' were integrally laminated with each other. Thereby, the solar cell element 2 was sealed with the protective sheets for a solar cell B', B', so that a solar cell module E was produced continuously and wound on a winding shaft, which is not shown.

For each of the solar cell modules produced by the above-described roll-to-roll method, peel strength and high temperature, high humidity durability were measured in the procedures described below. In addition, the occurrence of squeeze of the sealing materials for a solar cell in each of the solar cell modules was confirmed by the procedure described below. The results are shown in Tables 1 to 4.

(Peel Strength<Substrate-Protective Sheet for Solar Cell>)

For each of the produced solar cell modules, peel strength exhibited when the protective sheet for a solar cell laminated onto the solar cell element side was peeled off from the substrate of the solar cell was measured in accordance with JIS K6854. A symbol "-" was given for the case where a solar cell module could not be produced because of the occurrence of peeling of protective sheets for a solar cell and the peel strength of a solar cell module could not be measured.

(Peel Strength <Sealing Material for Solar Cell-Polyvinylidene Fluoride Sheet>)

For each of the produced solar cell modules, peel strength exhibited when the polyvinylidene fluoride sheet B1 was peeled off from the sealing material for a solar cell B of the protective sheet for a solar cell laminated onto the solar cell element side was measured in accordance with JIS K6854. A symbol "-" was given for the case where a solar cell module could not be produced because of the occurrence of peeling of protective sheets for a solar cell and the peel strength of a solar cell module could not be measured.

(High Temperature, High Humidity Durability <Adhesive>)

Each of the produced solar cell modules was allowed to stand under an environment of 85° C. and a relative humidity of 35% in accordance with the procedure disclosed in JIS C8990, and then it was observed at every 500 hours from the commencement of the allowing to stand of the solar cell module until the protective sheet for a solar cell laminated onto the solar cell element side peeled off from the substrate of the solar cell, so that the time at which peeling was confirmed was measured. JIS C8990, which defines the attestation conditions of solar cell modules, has required durability of 1000 hours or more and therefore the case where peeling off was confirmed in 1000 hours may be judged to be short in adhesive property. In Tables 1 to 4, a symbol "-" was given for the case where a solar cell module could not be produced because of the occurrence of peeling of protective sheets for a solar cell and high temperature, high humidity durability with respect to the adhesive property of a solar cell module could not be evaluated.

(High Temperature, High Humidity Durability <Power Generation Characteristic>)

Each of the produced solar cell modules was allowed to stand for 1000 hours under an environment of 85° C. and a relative humidity of 85% in accordance with the procedure disclosed in JIS C8990, and then the rate of decrease of the maximum output after the allowing to stand, $P_{max}$, based on the maximum output before the allowing to stand, $P_{max0}$, i.e., $P_{max}/P_{max0} \times 100$ [%], was calculated. For output measurement, 1116N produced by NISSHIN TOA INC. was used. In Tables 1 to 4, the case where the rate of decrease of the maximum output after 1000 hours was 95% or more was indicated by "excellent" and the case where the rate was lower than 95% was indicated by "bad". A symbol "-" was given for the case where a solar cell module could not be produced because of the occurrence of peeling of protective sheets for a solar cell and high temperature, high humidity durability with respect to the adhesive property of a solar cell module could not be evaluated.

(Occurrence of Squeeze of Sealing Material for Solar Cell)

For a solar cell module immediately after its production, whether or not a sealing material for a solar cell was squeezed out from the side surface of the solar cell module was confirmed visually. The case where the sealing material for a solar cell was not squeezed out from the side surface of the solar cell module was evaluated as "excellent" and the case where the sealing material for a solar cell B was squeezed out from the side surface of the solar cell module was evaluated as "bad". A symbol "-" was given for the case where a solar cell module could not be produced because of the occurrence of peeling of protective sheets for a solar cell and evaluation with respect to the occurrence of squeeze of a sealing material for a solar cell could not be done.

(Corrosion Suppressibility 1)

Using the protective sheets for a solar cell produced in Examples 1 to 16 and Comparative Examples 1 to 15, the corrosion suppressibility of the sealing material for a solar cell of each of the protective sheets for a solar cell was evaluated by performing an accelerated corrosion test in the following procedure.

A transparent conductive film made of zinc oxide (ZnO) was formed by a sputtering method throughout on a first surface of a plane rectangular glass substrate (0.7 μm in thickness). Then, two belt-like collecting electrodes with a fixed width were formed by applying a silver electrode paste to a second surface of the glass substrate and drying it, so that a pseudo solar cell element was obtained. In the pseudo solar cell element, the collecting electrodes each had been formed over the whole length of the glass substrate along its shorter side direction with the longitudinal direction of the collecting electrode being parallel to the shorter side direction of the glass substrate. The collecting electrodes each had been formed with both ends thereof in the longitudinal direction extending to the first surface side of the glass substrate and had covered the end surfaces of the glass substrate in the shorter side direction and both ends of the transparent conductive film continuing to the end surfaces. The two collecting electrodes had been formed with a fixed distance from each other along the longitudinal direction of the glass substrate.

Next, a laminated body was obtained by disposing the pseudo solar cell element between two protective sheets for a solar cell with the sealing materials for a solar cell thereof being opposed to the pseudo solar cell element. Of the two protective sheets for a solar cell, the protective sheet for a solar cell to be disposed on the second surface of the glass substrate of the pseudo solar cell element was shaped into a quadrangle frame form by forming a plane rectangular opening at the central portion of the sheet beforehand. The protective sheets for a solar cell were disposed on the second surface of the pseudo solar cell element so that two collecting electrodes formed on the second surface of the glass substrate of the pseudo solar cell element might be exposed to the outside through the opening of the protective sheet for a solar cell. Then, the above-mentioned laminated body was degassed by heating at 80° C. for 2.5 minutes using a vacuum laminator (manufactured by SPIRE; SPI-LAMINATOR 350) and then it was heated at 120° C. for 5 minutes, so that a pseudo solar cell module was prepared.

The pseudo solar cell module was allowed to stand for 1000 hours under an atmosphere of 85° C. and a relative humidity of 85% in accordance with JIS C8990. The electric resistance value between the two collecting electrodes of the pseudo solar cell module before and after standing was measured using a tester. The ratio ($R_1/R_0$) of the electric resistance value $R_1$ (Ω) of the pseudo solar cell module after standing to the electric resistance value $R_0$ (25.5Ω) of the pseudo solar cell module before standing is given in Tables 1 to 4. In Tables 1 to 4, a symbol "-" was given for the case where evaluation could not be done because peeling off occurred between the transparent conductive film and the sealing material for a solar cell in the pseudo solar cell module after standing. As corrosion of the transparent conductive film by the sealing material for a solar cell progresses, the electric resistance of the pseudo solar cell module becomes higher and the electric resistance ratio ($R_1/R_0$) becomes higher.

(Corrosion Suppressibility 2)

The corrosion suppressibility of the sealing material for a solar cell prepared in Comparative Example 16 was evaluated by performing an accelerated corrosion test in the procedure described below.

A transparent conductive film made of zinc oxide (ZnO) was formed by a sputtering method throughout on a first surface of a plane rectangular glass substrate (0.7 µm in thickness). Then, two belt-like collecting electrodes with a fixed width were formed by applying a silver electrode paste to a second surface of the glass substrate and drying it, so that a pseudo solar cell element was obtained. In the pseudo solar cell element, the collecting electrodes each had been formed over the whole length of the glass substrate along its shorter side direction with the longitudinal direction of the collecting electrode being parallel to the shorter side direction of the glass substrate. The collecting electrodes each had been formed with both ends thereof in the longitudinal direction extending to the first surface side of the glass substrate and had covered the end surfaces of the glass substrate in the shorter side direction and both ends of the transparent conductive film continuing to the end surfaces. The two collecting electrodes had been formed with a fixed distance from each other along the longitudinal direction of the glass substrate.

Then, a laminated body was obtained by laminating a sealing material for a solar cell and a 0.03-mm thick polyvinylidene fluoride sheet in this order onto the first surface of the glass substrate of the pseudo solar cell element and also laminating a sealing material for a solar cell and a 0.03-mm thick polyvinylidene fluoride sheet in this order onto the second surface of the glass substrate of the pseudo solar cell element. The sealing material for a solar cell and the polyvinylidene fluoride sheet laminated onto the second surface of the glass substrate of the pseudo solar cell element were shaped into a quadrangle frame form by forming a plane rectangular opening at their central portions beforehand. The sealing material for a solar cell and the polyvinylidene fluoride sheet were laminated onto the second surface of the pseudo solar cell element so that two collecting electrodes formed on the second surface of the glass substrate of the pseudo solar cell element might be exposed to the outside through the opening of the sealing material for a solar cell. Then, the above-mentioned laminated body was degassed by heating at 80° C. for 2.5 minutes using a vacuum laminator (manufactured by SPIRE; SPI-LAMINATOR 350) and then it was heated at 120° C. for 5 minutes, so that a pseudo solar cell module was prepared.

The pseudo solar cell module was allowed to stand for 1000 hours under an atmosphere of 85° C. and a relative humidity of 85% in accordance with JIS C8990. The electric resistance value between the two collecting electrodes of the pseudo solar cell module before and after standing was measured using a tester. The ratio ($R_1/R_0$) of the electric resistance value $R_1$ (Ω) of the pseudo solar cell module after standing to the electric resistance value $R_0$ (25.5Ω) of the pseudo solar cell module before standing was 14. As corrosion of the transparent conductive film by the sealing material for a solar cell progresses, the electric resistance of the pseudo solar cell module becomes higher and the electric resistance ratio ($R_1/R_0$) becomes higher.

(Preparation of Solar Cell Module: Vacuum Lamination Condition 1)

Figure 7:
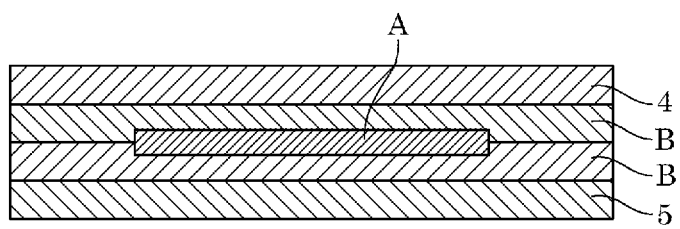
FIG. 7 is a schematic vertical sectional view illustrating another exemplary solar cell module using the sealing material for a solar cell of the present invention.

Solar cell modules illustrated in FIG. 7 were prepared in the following procedure using the protective sheets for a solar cell prepared in Examples 1, 2, 6, 10, 12, 14 and 16, and comparative Examples 1, 2, 4, 5, 13, and 15. First, there were prepared protective sheets for a solar cell and a solar cell A in which a film-like solar cell element had been formed on a substrate made of a flexible polyimide film. The protective sheet for a solar cell was laminated onto the solar cell element of the solar cell A with the solar cell element and the sealing material for a solar cell B being opposed to each other, and the protective sheet for a solar cell was laminated onto the polyimide film of the solar cell A with the sealing material for a solar cell B and the polyimide film being opposed to each other. Thereby, there was obtained a laminated body in which the polyvinylidene fluoride sheet 4 had been laminated as a transparent top side protective material onto the solar cell element 2 of the solar cell A via a sealing film for a solar cell B and the polyvinylidene fluoride sheet 5 had been laminated as a bottom side protective material onto the polyimide film of the solar cell A via the sealing film for a solar cell B.

Subsequently, the laminated body was degassed by heating at 80° C. for 2 minutes using a vacuum laminator (manufactured by SPIRE; SPI-LAMINATOR 350) and then the laminated body was heated at 100° C. for 3 minutes under a reduced pressure of 133 Pa while being pressed in its thickness direction. Thereby, the solar cell A was sealed with the sealing materials for a solar cell B, B and at the same time the solar cell A and the polyvinylidene fluoride sheets 4, 5 were adhesively attached via the sealing materials for a solar cell B, B, so that the solar cell module illustrated in FIG. 7 was produced.

(Preparation of Solar Cell Module: Vacuum Lamination Condition 1)

A solar cell module illustrated in FIG. 7 was prepared in the following procedure using the sealing material for a solar cell prepared in Comparative Example 16. First, there were prepared the sealing materials for a solar cell, a 0.03-mm thick polyvinylidene fluoride sheet, and a solar cell A in which a film-like solar cell element 2 had been formed on a substrate 1 made of a flexible polyimide film. A laminated body was prepared by laminating the sealing material for a solar cell B and the polyvinylidene fluoride sheet 4 as a transparent top side protective material in this order onto the solar cell element of the solar cell A and laminating the sealing material for a solar cell B and the polyvinylidene fluoride sheet 5 as a bottom side protective layer in this order onto the polyimide film of the solar cell A.

Subsequently, the laminated body was degassed by heating at 80° C. for 2 minutes using a vacuum laminator (manufactured by SPIRE; SPI-LAMINATOR 350) and then the laminated body was heated at 100° C. for 3 minutes under a reduced pressure of 133 Pa while being pressed in its thickness direction. Thereby, the solar cell A was sealed with the sealing materials for a solar cell 3, P and at the same time the solar cell A and the polyvinylidene fluoride sheets 4, 5 were adhesively attached via the sealing materials for a solar cell B, B, so that the solar cell module illustrated in FIG. 7 was produced.

(Preparation of Solar Cell Module: Vacuum Lamination Condition 2)

Solar cell modules illustrated in FIG. 7 were prepared in the following procedure using the protective sheets for a solar cell prepared in Examples 1, 2, 6, 10, 12, 14 and 16, and comparative Examples 1, 2, 4, 5, 13, and 15. First, there were prepared protective sheets for a solar cell and a solar cell A in which a film-like solar cell element had been formed on a substrate made of a flexible polyimide film. The protective sheet for a solar cell was laminated onto the solar cell element of the solar cell A with the solar cell element and the sealing material for a solar cell B being opposed to each other, and the protective sheet for a solar cell was laminated onto the polyimide film of the solar cell A with the sealing material for a solar cell B and the polyimide film being opposed to each other. Thereby, there was obtained a laminated body in which the polyvinylidene fluoride sheet 4 had been laminated as a transparent top side protective material onto the solar cell element 2 of the solar cell A via the sealing film for a solar cell B and the polyvinylidene fluoride sheet 5 had been laminated as a bottom side protective material onto the polyimide film of the solar cell A via the sealing film for a solar cell B.

Subsequently, the laminated body was degassed by heating at 80° C. for 2 minutes using a vacuum laminator (manufactured by SPIRE; SPI-LAMINATOR 350) and then the laminated body was heated at 120° C. for 3 minutes under a reduced pressure of 133 Pa while being pressed in its thickness direction. Thereby, the solar cell A was sealed with the sealing materials for a solar cell B, B and at the same time the solar cell A and the polyvinylidene fluoride sheets 4, 5 were adhesively attached via the sealing materials for a solar cell B, B, so that the solar cell module illustrated in FIG. 7 was produced.

(Preparation of Solar Cell Module: Vacuum Lamination Condition 2)

A solar cell module illustrated in FIG. 7 was prepared in the following procedure using the sealing material for a solar cell prepared in Comparative Example 16. First, there were prepared a protective sheet for a solar cell, a 0.03-mm thick polyvinylidene fluoride sheet, and a solar cell A in which a film-like solar cell element 2 had been formed on a substrate 1 made of a flexible polyimide film. A laminated body was prepared by laminating the sealing material for a solar cell B and the polyvinylidene fluoride sheet 4 as a transparent top side protective material in this order onto the solar cell element of the solar cell A and laminating the sealing material for a solar cell B and the polyvinylidene fluoride sheet 5 as a bottom side protective layer in this order onto the polyimide film of the solar cell A.

Subsequently, the laminated body was degassed by heating at 80° C. for 2 minutes using a vacuum laminator (manufactured by SPIRE; SPI-LAMINATOR 350) and then the laminated body was heated at 120° C. for 3 minutes under a reduced pressure of 133 Pa while being pressed in its thickness direction. Thereby, the solar cell A was sealed with the sealing materials for a solar cell B, E and at the same time the solar cell A and the polyvinylidene fluoride sheets 4, 5 were adhesively attached via the sealing materials for a solar cell B, B, so that the solar cell module illustrated in FIG. 7 was produced.

For each of the solar cell modules prepared by the above-described vacuum lamination, the occurrence of squeeze of the sealing materials for a solar cell was confirmed by the procedure described above. Moreover, for each of the above-described solar cell modules, peel strength <sealing material for a solar cell-polyvinylidene fluoride sheet> was measured in the procedure described below and the appearance quality was confirmed in the procedure described below. The results are shown in Tables 5 and 6.

(Peel Strength <Sealing Material for Solar Cell-Polyvinylidene Fluoride Sheet>)

For each of the produced solar cell modules, peel strength exhibited when the polyvinylidene fluoride sheet 4 was peeled off from the sealing material for a solar cell B was measured in accordance with JIS K6854. A symbol "-" was given for the case where a solar cell module could not be produced because of the occurrence of peeling of protective sheets for a solar cell and the peel strength of a solar cell module could not be measured.

(Appearance Quality in Sealing Material for Solar Cell)

Whether bubbles or wrinkles had been formed in the sealing material for a solar cell in the produced solar cell module was confirmed visually. The case where neither bubbles nor wrinkles had been formed in the sealing material for a solar cell was evaluated as "excellent", the case where bubbles had not been formed but wrinkles had been formed in the sealing material for a solar cell was evaluated as "good", and the case where both bubbles and wrinkles had been formed in the sealing material for a solar cell was evaluated as "bad". A symbol "-" was given for the case where a solar cell module could not be produced because of the occurrence of peeling of protective sheets for a solar cell and the appearance of a solar cell module could not be evaluated.

TABLE 1

| | | Example 1 | Example 2 | Example 3 | Example 4 | Example 5 | Example 6 | Example 7 | Example 8 |
|---|---|---|---|---|---|---|---|---|---|
| Butene-ethylene copolymer | Butene component (% by weight) | 16 | 1 | 16 | 3 | 10 | 20 | 25 | 16 |
| | Ethylene component (% by weight) | 84 | 99 | 84 | 97 | 90 | 80 | 75 | 84 |
| Modified butene resin | Total maleic anhydride content (% by weight) | 0.9 | 2 | 0.3 | 0.4 | 0.3 | 0.3 | 0.3 | 0.6 |
| | Content (% by weight) | 100 | 100 | 100 | 100 | 100 | 100 | 100 | 100 |
| Resin property | Melt flow rate (g/10 minutes) | 3 | 2 | 3 | 3 | 3 | 3 | 3 | 5 |
| | Maximum peak temperature (° C.) | 84 | 101 | 85 | 92 | 90 | 81 | 80 | 84 |
| | Viscoelastic storage modulus 30° C. ($\times 10^7$ Pa) | 2.5 | 7.8 | 2.4 | 3.6 | 2.7 | 2.2 | 2.0 | 2.3 |
| | 100° C. ($\times 10^4$ Pa) | 6.7 | 10.1 | 6.6 | 7.6 | 6.9 | 6.4 | 6.0 | 6.5 |
| 3-Glycidoxypropyltrimethoxysilane (part by weight) | | 0.6 | 0.5 | 0.6 | 0.5 | 0.5 | 0.5 | 0.5 | 0.5 |
| Peel strength (N/cm) <substrate-protective sheet for solar cell> | | 70 or more | 50 or more | 70 or more | 70 or more | 70 or more | 62 or more | 62 or more | 70 or more |
| Peel strength (N/cm) <sealing material for solar cell-polyvinylidene fluoride sheet> | | 4 | 3.7 | 3.9 | 3.8 | 4.1 | 4.2 | 4.2 | 4.1 |
| High temperature, high humidity durability <adhesive> (hour) | | 3000 or more | 3000 or more | 3000 or more | 2000 | 3000 or more | 3000 or more | 2000 | 3000 or more |
| High temperature, high humidity durability <power generation characteristic> | | Excellent | Excellent | Excellent | Excellent | Excellent | Excellent | Excellent | Excellent |

TABLE 1-continued

|  | Example 1 | Example 2 | Example 3 | Example 4 | Example 5 | Example 6 | Example 7 | Example 8 |
|---|---|---|---|---|---|---|---|---|
| Squeezing property of sealing material for solar cell | Excellent | Excellent | Excellent | Excellent | Excellent | Excellent | Excellent | Excellent |
| Electric resistance value ratio $R_1/R_0$ | 1.98 | 2.04 | 1.99 | 2.04 | 1.98 | 2.01 | 2.05 | 2.03 |

TABLE 2

|  |  | Example 9 | Example 10 | Example 11 | Example 12 | Example 13 | Example 14 | Example 15 | Example 16 |
|---|---|---|---|---|---|---|---|---|---|
| Butene-ethylene copolymer | Butene component (% by weight) | 16 | 16 | 16 | 16 | 16 | 16 | 16 | 16 |
|  | Ethylene component (% by weight) | 84 | 84 | 84 | 84 | 84 | 84 | 84 | 84 |
| Modified butene resin | Total maleic anhydride content (% by weight) | 0.2 | 0.1 | 1.5 | 3.0 | 0.9 | 0.6 | 0.6 | 0.6 |
|  | Content (% by weight) | 100 | 100 | 100 | 100 | 100 | 100 | 100 | 100 |
| Resin property | Melt flow rate (g/10 minutes) | 3 | 3 | 7 | 9 | 8 | 5 | 5 | 5 |
|  | Maximum peak temperature (° C.) | 85 | 85 | 83 | 81 | 84 | 85 | 85 | 85 |
|  | Viscoelastic storage modulus 30° C. (×10$^7$ Pa) | 2.4 | 2.4 | 2.0 | 2.0 | 2.0 | 2.4 | 2.4 | 2.4 |
|  | 100° C. (×10$^4$ Pa) | 6.5 | 6.5 | 5.9 | 5.8 | 5.8 | 6.6 | 6.6 | 6.6 |
| 3-Glycidoxypropyltrimethoxysilane (part by weight) |  | 0.5 | 0.6 | 0.6 | 0.6 | 0.5 | 0.1 | 0.2 | 1.5 |
| Peel strength (N/cm) <substrate-protective sheet for solar cell> |  | 50 or more | 25 or more | 78 or more | 78 or more | 70 or more | 50 or more | 78 or more | 78 or more |
| Peel strength (N/cm) <sealing material for solar cell-polyvinylidene fluoride sheet> |  | 3.9 | 4.3 | 3.6 | 4.4 | 4.4 | 4.2 | 4.3 | 3.8 |
| High temperature, high humidity durability <adhesive> (hour) |  | 3000 or more | 2000 | 2000 | 1500 | 3000 or more | 2000 | 3000 or more | 3000 or more |
| High temperature, high humidity durability <power generation characteristic> |  | Excellent | Excellent | Excellent | Excellent | Excellent | Excellent | Excellent | Excellent |
| Squeezing property of sealing material for solar cell |  | Excellent | Excellent | Excellent | Excellent | Excellent | Excellent | Excellent | Excellent |
| Electric resistance value ratio $R_1/R_0$ |  | 2.00 | 1.99 | 2.04 | 2.02 | 2.03 | 2.01 | 2.01 | 1.99 |

TABLE 3

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Butene-ethylene copolymer | Butene component (% by weight) | 16 | 16 | — | — | 16 | 90 | 16 |
|  | Ethylene component (% by weight) | 84 | 84 | 100 | 100 | 84 | 10 | 84 |
| Modified butene resin | Total maleic anhydride content (% by weight) | 0.9 | 0.9 | 0 | 1.0 | 0 | 8.0 | 0.9 |
|  | Content (% by weight) | 100 | 100 | 100 | 100 | 100 | 100 | 100 |
| Resin property | Melt flow rate (g/10 minutes) | 3.0 | 3.0 | 3.0 | 0.5 | 67.0 | 0.1 | 3.0 |
|  | Maximum peak temperature (° C.) | 85 | 85 | 115 | 120 | 78 | 129 | 85 |
|  | Viscoelastic storage modulus 30° C. (×10$^7$ Pa) | 2.5 | 2.5 | 32 | 39 | 1.5 | 68 | 2.5 |
|  | 100° C. (×10$^4$ Pa) | 6.7 | 6.7 | 21.2 | 31 | 5.5 | 95 | 6.7 |
| 3-Glycidoxypropyltrimethoxysilane (part by weight) |  | 0 | 0 | 0.6 | 0.6 | 0.6 | 0.6 | 20 |
| 3-Acryloxypropyltrimethoxysilane (part by weight) |  | 0 | 0.6 | 0 | 0 | 0 | 0 | 0 |
| Peel strength (N/cm) <substrate-protective sheet for solar cell> |  | 20 | 20 | — | — | — | — | — |
| Peel strength (N/cm) <sealing material for solar cell-polyvinylidene fluoride sheet> |  | 0.2 | 0.3 | 1.3 | 4.4 | 0.9 | 3.8 | 4.1 |
| High temperature, high humidity durability <adhesive> (hour) |  | 1000 | 1000 | — | — | — | — | — |
| High temperature, high humidity durability <power generation characteristic> |  | — | — | — | — | — | — | — |
| Squeezing property of sealing material for solar cell |  | Bad | Bad | Bad | Excellent | Bad | Excellent | Bad |
| Electric resistance value ratio $R_1/R_0$ |  | 4.41 | 4.55 | — | — | — | — | — |

TABLE 4

|  |  | Comparative Example 8 | Comparative Example 9 | Comparative Example 10 | Comparative Example 11 | Comparative Example 12 | Comparative Example 13 | Comparative Example 14 | Comparative Example 15 |
|---|---|---|---|---|---|---|---|---|---|
| Butene-ethylene copolymer | Butene component (% by weight) | — | EVA 100 parts by weight | 16 | 16 | 16 | 30 | 16 | EEAM 100 parts by weight |
|  | Ethylene component (% by weight) | 100 |  | 84 | 84 | 84 | 70 | 84 |  |
| Modified butene resin | Total maleic anhydride content (% by weight) | 0.01 |  | 0.01 | 0.3 | 5.0 | 0.3 | 0.3 |  |
|  | Content (% by weight) | 100 |  | 100 | 100 | 100 | 100 | 100 |  |
| Resin property | Melt flow rate (g/10 minutes) | 0.5 | 30 | 3.0 | 3.0 | 9.0 | 4.0 | 3.0 | 20 |
|  | Maximum peak temperature (° C.) | 114 | 67 | 85 | 85 | 78 | 69 | 85 | 80 |
|  | Viscoelastic storage modulus 30° C. (×10$^7$ Pa) | 34 | 1.04 | 2.5 | 2.4 | 1.6 | 1.5 | 2.4 | 1.7 |
|  | 100° C. (×10$^4$ Pa) | 20.1 | 130 | 6.7 | 6.6 | 5.0 | 5.1 | 87 | 5 |
| 3-Glycidoxypropyltrimethoxysilane (part by weight) |  | 0.5 | 0.5 | 0.5 | 0.02 | 0.5 | 0.5 | 18 | 0.6 |
| Peel strength (N/cm) <substrate-protective sheet for solar cell> |  | — | — | 10 or more | 5 or lower | 70 or more | 70 or more | — | 70 or more |
| Peel strength (N/cm) <sealing material for solar cell-polyvinylidene fluoride sheet> |  | 0.5 | 0.6 | 0.5 | 0.4 | 4.1 | 3.9 | 1.8 | 2.2 |
| High temperature, high humidity durability <adhesive> (hour) |  | — | — | 1000 | 1000 | 3000 or more | 1000 | — | 3000 |
| High temperature, high humidity durability <power generation characteristic> |  | — | — | — | — | Bad | — | — | Bad |
| Squeezing property of sealing material for solar cell |  | Bad | Bad | Bad | Bad | Excellent | Excellent | Bad | Bad |
| Electric resistance value ratio $R_1/R_0$ |  | — | — | — | — | 7.2 | — | — | 10.5 |

TABLE 5

|  |  | Example 1 | Example 2 | Example 6 | Example 10 | Example 12 | Example 14 | Example 16 |
|---|---|---|---|---|---|---|---|---|
| Butene-ethylene copolymer | Butene component (% by weight) | 16 | 1 | 20 | 16 | 16 | 16 | 16 |
|  | Ethylene component (% by weight) | 84 | 99 | 80 | 84 | 84 | 84 | 84 |
| Modified butene resin | Total maleic anhydride content (% by weight) | 0.9 | 2 | 0.3 | 0.1 | 3 | 0.6 | 0.6 |
|  | Content (% by weight) | 100 | 100 | 100 | 100 | 100 | 100 | 100 |
| Resin property | Melt flow rate (g/10 minutes) | 3 | 2 | 3 | 3 | 9 | 5 | 5 |
|  | Maximum peak temperature (° C.) | 84 | 101 | 81 | 85 | 81 | 85 | 85 |
|  | Viscoelastic storage modulus 30° C. (×10$^7$ Pa) | 2.5 | 7.8 | 2.2 | 2.4 | 2 | 2.4 | 2.4 |
|  | 100° C. (×10$^4$ Pa) | 6.7 | 10.1 | 6.4 | 6.5 | 5.8 | 6.6 | 6.6 |
| 3-Glycidoxypropyltrimethoxysilane (part by weight) |  | 0.6 | 0.5 | 0.5 | 0.6 | 0.6 | 0.1 | 1.5 |
| Solar cell module (vacuum lamination condition 1) | Squeezing property of sealing material for solar cell | Excellent | Excellent | Excellent | Excellent | Excellent | Excellent | Excellent |
|  | Peel strength (N/cm) <sealing material for solar cell-polyvinylidene fluoride sheet> | 70 or more | 70 or more | 70 or more | 70 or more | 70 or more | 70 or more | 70 or more |
|  | Appearance quality | Excellent | Excellent | Excellent | Excellent | Excellent | Excellent | Excellent |
| Solar cell module (vacuum lamination condition 2) | Squeezing property of sealing material for solar cell | Excellent | Excellent | Excellent | Excellent | Excellent | Excellent | Excellent |
|  | Peel strength (N/cm) <sealing material for solar cell-polyvinylidene fluoride sheet> | 70 or more | 70 or more | 70 or more | 70 or more | 70 or more | 70 or more | 70 or more |
|  | Appearance quality | Excellent | Excellent | Excellent | Excellent | Excellent | Excellent | Excellent |

TABLE 6

|  |  | Comparative Example 1 | Comparative Example 2 | Comparative Example 4 | Comparative Example 5 | Comparative Example 13 | Comparative Example 15 | Comparative Example 16 |
|---|---|---|---|---|---|---|---|---|
| Butene-ethylene copolymer | Butene component (% by weight) | 15 | 16 | — | 16 | 30 | EEAM 100 parts by weight | EVA 100 parts by weight |
|  | Ethylene component (% by weight) | 84 | 84 | 100 | 84 | 70 |  |  |
| Modified butene resin | Total maleic anhydride content (% by weight) | 0.9 | 0.9 | 1 | 0 | 0.3 |  |  |
|  | Content (% by weight) | 100 | 100 | 100 | 100 | 100 |  |  |

TABLE 6-continued

| | | Comparative Example 1 | Comparative Example 2 | Comparative Example 4 | Comparative Example 5 | Comparative Example 13 | Comparative Example 15 | Comparative Example 16 |
|---|---|---|---|---|---|---|---|---|
| Resin property | Melt flow rate (g/10 minutes) | 3 | 3 | 0.5 | 67 | 4 | 20 | 30 |
| | Maximum peak temperature (° C.) | 85 | 85 | 120 | 78 | 69 | 80 | 67 |
| | Viscoelastic 30° C. (×$10^7$ Pa) storage modulus | 2.5 | 2.5 | 39 | 1.5 | 1.5 | 1.7 | 1.04 |
| | 100° C. (×$10^4$ Pa) | 6.7 | 6.7 | 31 | 5.5 | 5.1 | 5 | 130 |
| 3-Glycidoxypropyltrimethoxysilane (part by weight) | | 0 | 0 | 0.6 | 0.6 | 0.5 | 0.6 | 0 |
| 3-Acryloxypropyltrimethoxysilane (part by weight) | | 0 | 0.6 | 0 | 0 | 0 | 0 | 0 |
| Solar cell module (vacuum lamination condition 1) | Squeezing property of sealing material for solar cell | Bad | Bad | — | Bad | Bad | Bad | — |
| | Peel strength (N/cm) <sealing material for solar cell-polyvinylidene fluoride sheet> | 40 | 40 | — | 40 | 70 | 70 | — |
| | Appearance quality | Excellent | Excellent | — | Excellent | Excellent | Excellent | — |
| Solar cell module (vacuum lamination condition 2) | Squeezing property of sealing material for solar cell | Bad | Bad | Excellent | Bad | Bad | Bad | — |
| | Peel strength (N/cm) <sealing material for solar cell-polyvinylidene fluoride sheet> | 40 | 40 | 10 | 40 | 70 | 70 | — |
| | Appearance quality | Excellent | Excellent | Excellent | Excellent | Good | Good | — |

INDUSTRIAL APPLICABILITY

Use of the sealing material for a solar cell of the present invention allows efficient production of a solar cell module and also can provide a solar cell module capable of maintaining high cell performance for a long term.

EXPLANATION OF REFERENCE SYMBOLS

1 Substrate
2 Solar cell element
A Solar cell
B Sealing material for solar cell
B' Protective sheet for solar cell
C Laminated sheet
D Roll
E Solar cell module

The invention claimed is:

1. A sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group.

2. The sealing material for a solar cell according to claim 1, wherein the silane compound is a silane compound represented by the following general formula (I):

[Chemical Formula 1]

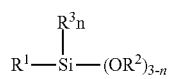

(I)

wherein $R^1$ represents a 3-glycidoxypropyl group or a 2-(3,4-epoxycyclohexyl)ethyl group, $R^2$ represents an alkyl group having 1 to 3 carbon atoms, $R^3$ represents an alkyl group having 1 to 3 carbon atoms, and n is 0 or 1.

3. A protective sheet for a solar cell comprising a fluoropolymer sheet integrally laminated onto one surface of the sealing material for a solar cell according to claim 1.

4. A process for production of a solar cell module, comprising a lamination step in which a laminated sheet is produced by continuously laminating the sealing material for a solar cell according to claim 1 onto a solar cell element mounted in a solar cell including the solar cell element formed in a thin film form on a flexible elongate substrate; and an sealing step in which the solar cell element of the solar cell is sealed with the sealing material for a solar cell by heating the laminated sheet while applying a pressing force thereto in the thickness direction thereof.

5. The process for production of a solar cell module according to claim 4, wherein the lamination step is a step in which a protective sheet for a solar cell including a fluoropolymer sheet integrally laminated onto one surface of a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group is laminated onto a solar cell element mounted in a solar cell including the solar cell element formed in a thin film form on a flexible elongate substrate with the solar cell element being opposed to the sealing material for a solar cell, so that the laminated sheet is produced.

6. The process for production of a solar cell module according to claim 4, wherein the lamination step is a step in which the laminated sheet is produced by further laminating a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group continuously onto the substrate, and the sealing step is a step in which the solar cell is sealed with the sealing material for a solar cell laminated onto the solar cell element and the sealing material for a solar cell laminated onto the substrate.

7. A process for production of a solar cell module, comprising a lamination step in which a laminated body is produced by laminating a transparent top side protective material via a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group onto a top surface of a solar cell and laminating a bottom side protective material via a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group onto a bottom surface of the solar cell; and a sealing step in which the solar cell is sealed with the sealing materials for a solar cell by heating the laminated body while pressing the laminated body in its thickness direction.

8. The process for production of a solar cell module according to claim 7, wherein the lamination step is a step in which a first protective sheet for a solar cell including a fluoropolymer sheet integrally laminated as the transparent top side protective material onto one surface of a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group is laminated onto the top surface of the solar cell with the solar cell being opposed to the sealing material for a solar cell, and a second protective sheet for a solar cell including a fluoropolymer sheet integrally laminated as the bottom side protective material onto one surface of a sealing material for a solar cell comprising 100 parts by weight of a modified butene-based resin that is produced by graft-modifying a butene-ethylene copolymer having a butene content of 1 to 25% by weight with maleic anhydride and has a total content of the maleic anhydride of 0.1 to 3% by weight, and 0.1 to 15 parts by weight of a silane compound having an epoxy group is laminated onto the bottom surface of the solar cell with the solar cell being opposed to the sealing material for a solar cell, so that the laminated body is produced.

\* \* \* \* \*